US009632498B2

(12) United States Patent
Chang et al.

(10) Patent No.: US 9,632,498 B2
(45) Date of Patent: *Apr. 25, 2017

(54) SYSTEMS AND METHODS OF COMPENSATING FOR FILLING MATERIAL LOSSES IN ELECTROPLATING PROCESSES

(71) Applicant: Taiwan Semiconductor Manufacturing Co., Ltd., Hsinchu Science Park (TW)

(72) Inventors: Chih-Yi Chang, New Taipei (TW); Liang-Yueh Ou Yang, New Taipei (TW); Chen-Yuan Kao, Zhudong Township (TW); Hung-Wen Su, Jhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 685 days.

This patent is subject to a terminal disclaimer.

(21) Appl. No.: 13/870,025

(22) Filed: Apr. 25, 2013

(65) Prior Publication Data

US 2014/0277681 A1 Sep. 18, 2014

Related U.S. Application Data

(60) Provisional application No. 61/776,924, filed on Mar. 12, 2013.

(51) Int. Cl.

| | |
|---|---|
| ***G05B 19/418*** | (2006.01) |
| ***H01L 23/522*** | (2006.01) |
| *H01L 21/288* | (2006.01) |
| *H01L 21/768* | (2006.01) |

(52) U.S. Cl.

CPC ...... *G05B 19/41835* (2013.01); *H01L 23/522* (2013.01); *H01L 21/2885* (2013.01); *H01L 21/76877* (2013.01); *H01L 2924/0002* (2013.01)

(58) Field of Classification Search

None

See application file for complete search history.

(56) References Cited

U.S. PATENT DOCUMENTS

| | | | | |
|---|---|---|---|---|
| 8,719,755 B2 * | 5/2014 | Chou | G06F 17/5068 | 716/119 |
| 2002/0157076 A1 * | 10/2002 | Asakawa | H01L 21/31053 | 438/626 |
| 2004/0026255 A1 * | 2/2004 | Kovarsky | C25D 21/18 | 205/99 |
| 2006/0097399 A1 * | 5/2006 | Hatano | G06F 17/5068 | 257/773 |
| 2007/0245284 A1 * | 10/2007 | Sinha | G06F 17/5068 | 716/54 |

(Continued)

*Primary Examiner* — Bernard G Lindsay

(74) *Attorney, Agent, or Firm* — Duane Morris LLP

(57) ABSTRACT

A computer-implemented system and method of compensating for filling material losses in a semiconductor process. The computer-implemented method includes determining using a computer a pattern density difference between a first circuit pattern above a semiconductor substrate and a second circuit pattern adjacent to the first pattern. A dummy pattern is inserted between the first pattern and the second pattern so as to compensate for an estimated loss of filling material induced during electrochemical plating by the pattern density difference exceeding a threshold pattern density difference.

17 Claims, 10 Drawing Sheets

(56) References Cited

U.S. PATENT DOCUMENTS

2008/0038847 A1* 2/2008 Young ............... H01L 21/31053 438/5
2010/0041232 A1* 2/2010 Summerfelt ........ G06F 17/5068 438/669

* cited by examiner

SYSTEMS AND METHODS OF COMPENSATING FOR FILLING MATERIAL LOSSES IN ELECTROPLATING PROCESSES

CROSS-REFERENCES

The present application is with and claims the priority benefit of the provisional application entitled, "Systems and Methods of Compensating for Filling Material Losses in Electroplating Processes," Application Ser. No. 61/776,924, filed on Mar. 12, 2013, the entirety of which is incorporated herein by reference.

FIELD OF THE INVENTION

The present disclosure is directed generally to metallization of integrated circuits and more particularly to systems and methods of compensating for filling material losses in electroplating processes.

DESCRIPTION OF THE RELATED ART

Electroplating (ECP) processes are critical to the fabrication of integrated circuits (IC). In ECP processes, filling material such as copper (Cu) is patterned using a damascene process where trenches are etched into an oxide (or other dielectric) material and a filling material is deposited into a semiconductor wafer to fill up the trenches. The ECP process is typically followed by a chemical mechanical planarization (CMP) process where excess filling material is removed from the oxide surface to leave the filling material in the trenches and form interconnect wires and vias.

Conventional ECP processes suffer from void formation in trenches which causes the formation of an open circuit. Conventional bottom-up filling processes deposit filling material at the bottom of the trench and move upwards. Additive chemicals such as accelerators and suppressors are added to the plating solution in an ECP process and are adsorbed on the wafer surface to accelerate or suppress local deposition rates. During ECP processes, suppressors are displaced from the bottom of the trenches by accelerators due to the suppressors' weaker adsorbing ability. Suppressors form a film on the surface to inhibit the current flow at a given voltage. At high pattern density edges, a higher concentration of suppressors is adsorbed causing slower bottom up rates and losses in filling material.

BRIEF DESCRIPTION OF THE DRAWINGS

Various aspects of the present disclosure will be or become apparent to one with skill in the art by reference to the following detailed description when considered in connection with the accompanying exemplary non-limiting embodiments.

DETAILED DESCRIPTION OF THE EXAMPLES

Figure 1:
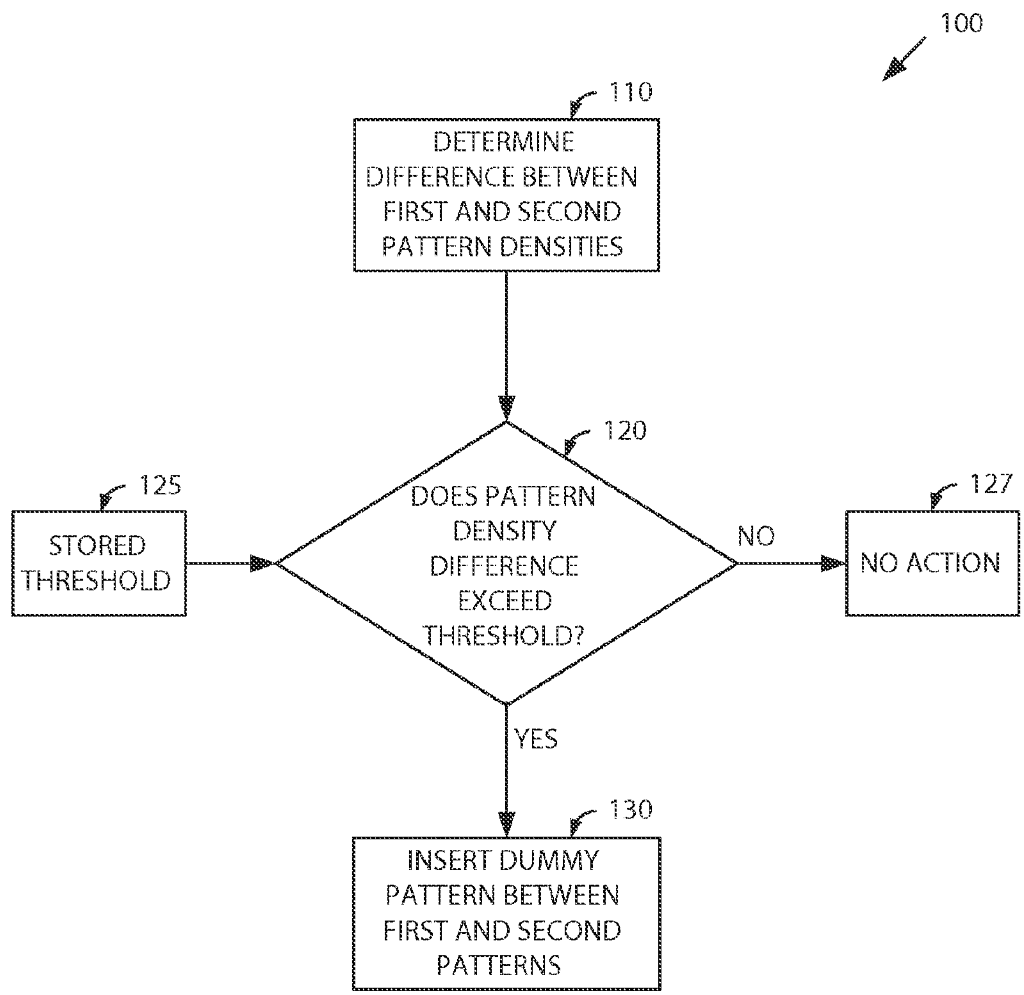
FIG. 1 is a flow chart illustrating a computer-implemented method of compensating for filling material losses in an electroplating process according to embodiments of the present disclosure.

With reference to the Figures, where like elements have been given like numerical designations to facilitate an understanding of the drawings, the various embodiments of a system and method of compensating for a local focus error in a semiconductor process are described. The figures are not drawn to scale.

The following description is provided as an enabling teaching of a representative set of examples. Many changes can be made to the embodiments described herein while still obtaining beneficial results. Some of the desired benefits discussed below can be obtained by selecting some of the features or steps discussed herein without utilizing other features or steps. Accordingly, many modifications and adaptations, as well as subsets of the features and steps described herein are possible and can even be desirable in certain circumstances. Thus, the following description is provided as illustrative and is not limiting.

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present disclosure. Relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise. The term "adjacent" as used herein to describe the relationship between structures/components includes both direct contact between the respective structures/components referenced and the presence of other intervening structures/components between respective structures/components.

As used herein, use of a singular article such as “a,” “an” and “the” is not intended to exclude pluralities of the article’s object unless the context clearly and unambiguously dictates otherwise.

Systems and methods of compensating for filling material losses in electroplating processes are provided. The systems and processes described herein are not limited to any specific electroplating process technology, production area, equipment, technology node, fabrication tool, wafer size, back end of line layer, etc. The inventors have developed a system and method of compensating for filling material losses that is capable of achieving a substantially uniform pattern density across a layer and reducing the localized pattern density gradient across patterns in a layer in order to improve yield and decrease costs.

The inventors have observed that a high concentration of suppressors are adsorbed at high pattern density edges, resulting in slower bottom up rates and higher losses in filling material. The inventors have also observed that slow plating zones (zones of low filling material bottom up rates) are prevalent, and filling material losses are more significant, along the plating flow direction and at the edge of the semiconductor wafer. The inventors have further observed that slow plating zones are prevalent in regions mixing patterns of high and low pattern densities and that filling material losses increase as the gradient in pattern densities also increases across patterns in these slow plating zones.

The inventors have developed novel systems and methods to compensate for these filling material losses. The inventors have determined that these novel systems and methods are critical to compensate for filling material losses associated with ECP processes that will otherwise continue to increase, especially at wafer edges, as pattern densities continue to increase in wafers. The inventors have observed that, in practice, by determining the pattern density (e.g. line edge density) of respective patterns of a wafer, and the respective line edge density gradient along adjacent patterns, relevant filling material losses can be estimated. As used herein, line edge density is a value determined as the ratio of the sum of the respective perimeters of each object in a pattern to the area of the pattern. The inventors have determined that by minimizing the local line edge density gradient along the ECP process plating flow direction, filling material losses can be reduced and voids can be avoided.

FIG. 1 is a flow chart illustrating a computer-implemented method 100 of compensating for filling material losses in an electroplating process according to embodiments of the present disclosure. At block 110, a pattern density difference between a first circuit pattern above a semiconductor substrate and a second circuit pattern adjacent to the first circuit pattern is determined using a computer. In some embodiments, a pattern density of a first circuit pattern and a pattern density of a second circuit pattern are determined using a computer. In some embodiments, the first circuit pattern and the second circuit pattern are circuit patterns in a conductive line layer or a metal line layer (e.g., M1, M2, etc.). In some embodiments, the first circuit pattern and the second circuit pattern are circuit patterns in a via layer (e.g. V1, V2, etc.). In some embodiments, the first circuit pattern and the second circuit pattern are patterns in an interconnect layer. Pattern density can be determined using any suitable method of determining pattern density. For example, referring now to FIG. 3, a plan view of an example of a circuit pattern 300 illustrating a method of determining pattern density in an electroplating process according to embodiments of the present disclosure is provided. In the illustrated embodiment, a pattern density or line edge density can be determined by determining two layout parameters, namely the pattern perimeter sum and the pattern area. The perimeter sum parameter can be determined by computing a sum of the perimeters of each of a plurality of objects 310*a-e* (e.g. polygons) in the circuit pattern 300.

Figure 3:
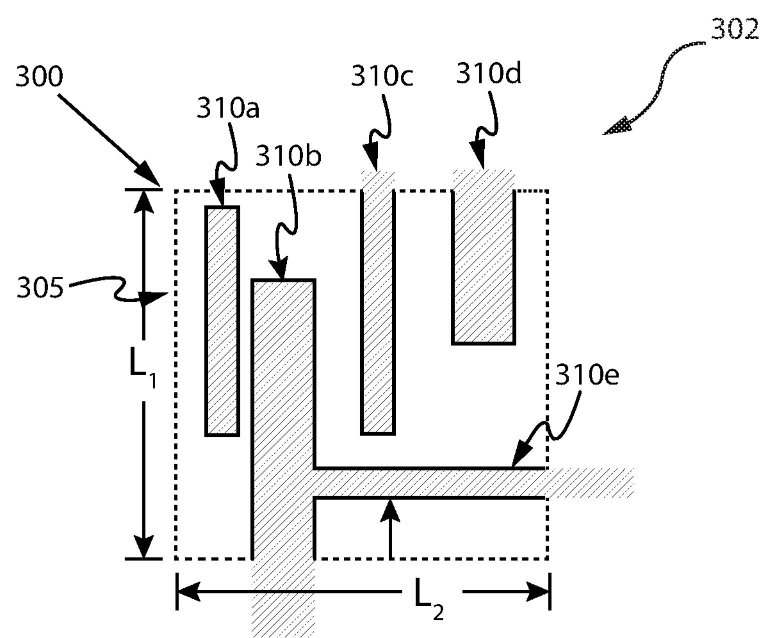
FIG. 3 is a plan view of an example of a circuit pattern illustrating a method of determining pattern density in an electroplating process according to embodiments of the present disclosure.

As shown in FIG. 3, in some embodiments, a layout window 302 can define boundaries of the circuit pattern 300 such that the perimeter sum parameter is determined by computing a sum of the perimeters of each of a plurality of objects 310*a-e* (e.g. polygons) in the layout window 302. The pattern area parameter can be determined by determining the area of the circuit pattern 300. In the illustrated embodiment, the pattern area parameter is determined by multiplying the lengths $L_1$ and $L_2$ as bounded by layout window 302. In the illustrated embodiment, the pattern density (e.g. line edge density) for circuit pattern 300 is the ratio of the determined value for the perimeter sum parameter to the determined value for the pattern area parameter. In the illustrated embodiment, the units of pattern density (e.g. line edge density) are 1/(unit of length) (e.g. 1/Angstrom).

Referring back to FIG. 1, at block 110, the difference between a pattern density of a first circuit pattern above a semiconductor substrate and a pattern density of a second circuit pattern adjacent to the first circuit pattern is determined using a computer. At block 120, the determined pattern density difference is compared to a threshold pattern density difference. At block 125, the threshold pattern density difference is stored, for example, in a tangible, non-transitory machine readable storage medium. The threshold pattern density difference is a value above which the pattern density gradient (e.g. line edge density gradient) along adjacent circuit patterns will result in filling material losses during an electrochemical plating process. The inventors have observed, in practice, during the performance of ECP processes, low pattern density patterns have a higher suppressor concentration at the surface and high pattern density patterns have a lower suppressor concentration at the surface and thus a high concentration of suppressors are adsorbed at high pattern density edges, resulting in slower bottom up rates and higher losses in filling material. The inventors have observed that, in a wafer map or layout, slow plating zones form, and filling material losses are more significant, at a boundary or a transition point between a circuit pattern having a high pattern density and a circuit pattern having a low pattern density, and are even more prevalent in circuit patterns along the plating flow direction and at the edge of the semiconductor wafer. The inventors have observed, in practice, that as the pattern density gradient along adjacent circuit patterns increases, filling material losses during electrochemical plating processes correspondingly increase due to slower bottom up fill rates at these boundaries or transition points.

The threshold pattern density difference is a value to compensate for the filling material losses during an electrochemical plating process induced by the pattern density difference between the first circuit pattern and the adjacent second circuit pattern. In some embodiments, a threshold pattern density difference can be a value between approximately 5/(unit of length) (e.g. 4/(unit of length)) and approximately 20/(unit of length) (e.g. 21/(unit of length)). In some embodiments, a threshold pattern density difference can be a value of approximately 10/(unit of length) (e.g. 9-11/(unit of length)). In some embodiments, the units of threshold pattern density difference match the units of pattern density. For example, in the illustrated embodiment of FIG. 3, the units of threshold pattern density difference (e.g. threshold line edge density difference) are 1/(unit of length) (e.g. 1/Angstrom).

At block 127, if the pattern density difference is determined to be less than the threshold pattern density difference, no action is required. However, as shown at block 130, if the pattern density difference is determined to exceed the threshold pattern density difference, a dummy pattern is inserted to reduce the value of the pattern density gradient so as to compensate for an estimated loss of filling material (e.g. copper (Cu)) during an electrochemical plating process. The location for inserting the dummy pattern can be dependent upon various factors including, but not limited to, the wafer map or die map, the ECP process flow direction (e.g. center to edge on a wafer map) and/or the local pattern density gradients across the wafer map. In some embodiments, a dummy pattern can be inserted between a first circuit pattern and a second circuit pattern where the pattern density difference between the two circuit patterns exceeds the threshold pattern density difference. In some embodiments, dummy patterns can be inserted in a first or second circuit pattern region to decrease the pattern density difference between the first circuit pattern region and the second circuit pattern region where the pattern density difference between the two circuit pattern regions exceeds the threshold pattern density difference. In some embodiments, a dummy pattern is selected based on a comparison between a determined pattern density difference and a threshold pattern density difference. In some embodiments, a plurality of dummy patterns can be inserted between a first circuit pattern and a second circuit pattern based on a comparison between a determined pattern density difference and a threshold pattern density difference. In some embodiments, a plurality of dummy patterns can be inserted in a first or second circuit pattern region based on a comparison between a determined pattern density difference and a threshold pattern density difference.

In some embodiments, the size of the dummy pattern and/or the dummy pattern density can be selected based on a comparison between a determined pattern density difference and a threshold pattern density difference. For example, in some embodiments, a dummy pattern having a pattern density between respectively determined pattern densities of a first circuit pattern and an adjacent second circuit pattern can be selected so as to compensate for an estimated loss of filling material during an electrochemical plating process induced by the pattern density gradient along the first and second circuit patterns. By way of example, in some embodiments, in first and second circuit patterns adjacent to one another and disposed along the direction of ECP plating flow, the first pattern can be determined to have a pattern density of 2/Angstrom and the second pattern can be determined to have a pattern density of 13/Angstrom. The determined pattern density difference is 11/Angstrom. If the threshold pattern density difference is defined as a value greater than or equal to 10/Angstrom, at block 120, the pattern density difference is determined to exceed the threshold pattern density difference and a dummy pattern is selected. In this example, a dummy pattern having a pattern density between the first pattern density and the second pattern density (e.g. 5, 7, 8, etc.) can be inserted between the first circuit pattern and the second circuit pattern so as to compensate for filling material (e.g. copper) losses during an electrochemical plating process induced by the local pattern density gradient. In some embodiments, a plurality of dummy patterns having a pattern density between the first pattern density and the second pattern density (e.g. 5, 7, 8, etc.) can be inserted in a first circuit pattern region so as to compensate for filling material (e.g. copper) losses during an electrochemical plating process induced by the global or region pattern density gradient.

Figure 2:
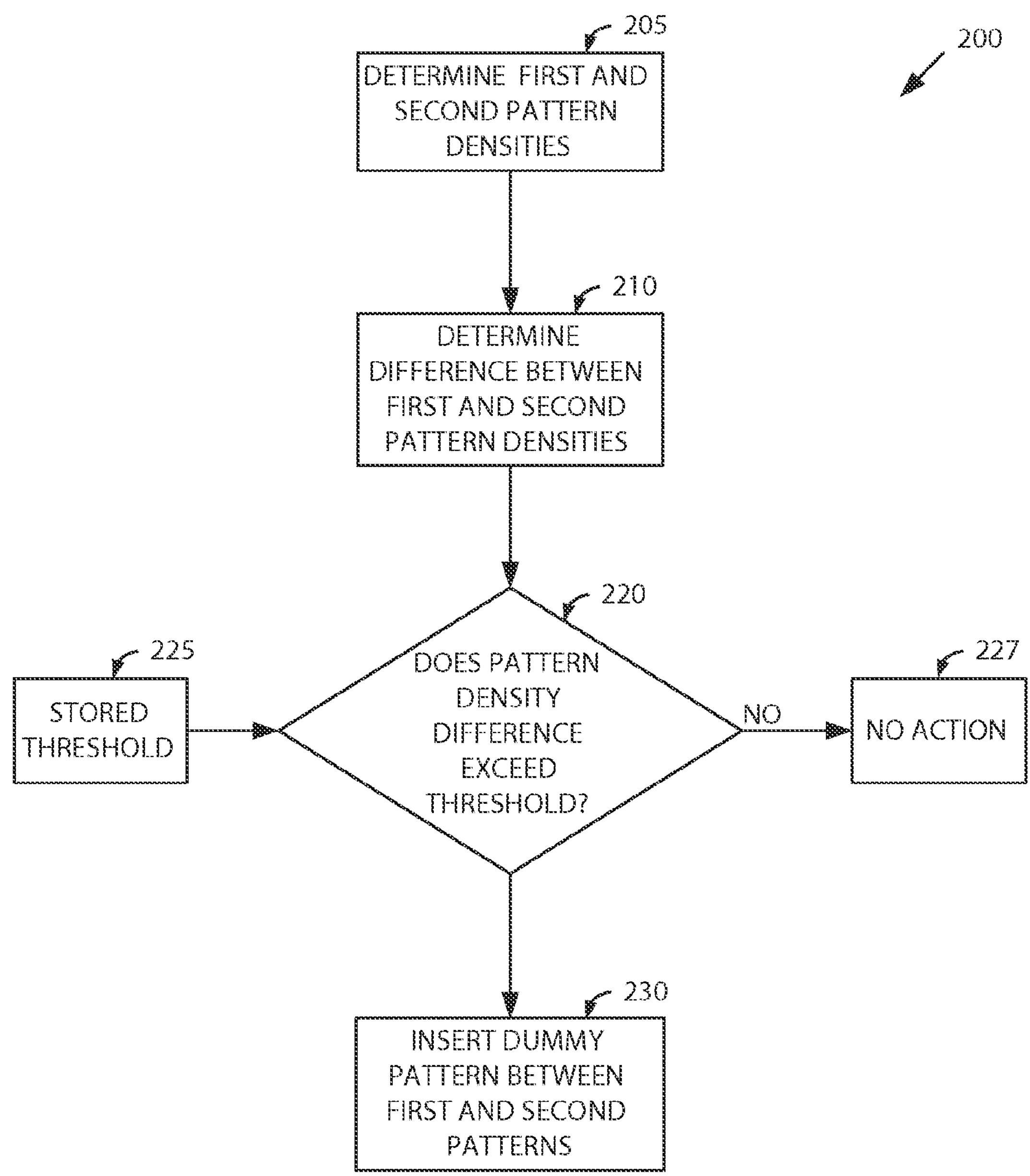
FIG. 2 is a flow chart illustrating a computer-implemented method of compensating for filling material losses in an electroplating process according to some embodiments.

Referring now to FIG. 2, a flow chart illustrating a computer-implemented method 200 of compensating for filling material losses during an electroplating process according to embodiments of the present disclosure is provided. At block 205, first and second circuit pattern densities are determined using a computer as described above for block 110 in FIG. 1 and FIG. 3. At block 210, the difference between a pattern density of a first circuit pattern and a pattern density of a second circuit pattern adjacent to the first circuit pattern is determined using a computer as described above for block 110. At block 220, the determined pattern density difference is compared to a threshold pattern density difference as described above for block 120. At block 225, the threshold pattern density difference is stored, for example, in a tangible, non-transitory machine readable storage medium. At block 227, if the pattern density difference is determined to be less than the threshold pattern density difference, no action is required as described above for block 127. At block 230, if the pattern density difference of the first and second circuit patterns is determined to exceed the threshold pattern density difference, a dummy pattern is inserted between the first and second circuit patterns to reduce the value of the pattern density gradient so as to compensate for an estimated loss of filling material (e.g. copper (Cu)) during an electrochemical plating process as described above for block 130. In some embodiments, if the pattern density difference of the first and second circuit pattern regions is determined to exceed the threshold pattern density difference, dummy patterns are inserted in the first or second circuit pattern region to to reduce the value of the pattern density gradient so as to compensate for an estimated loss of filling material (e.g. copper (Cu)) during an electrochemical plating process as described above for block 130.

Figure 4A:
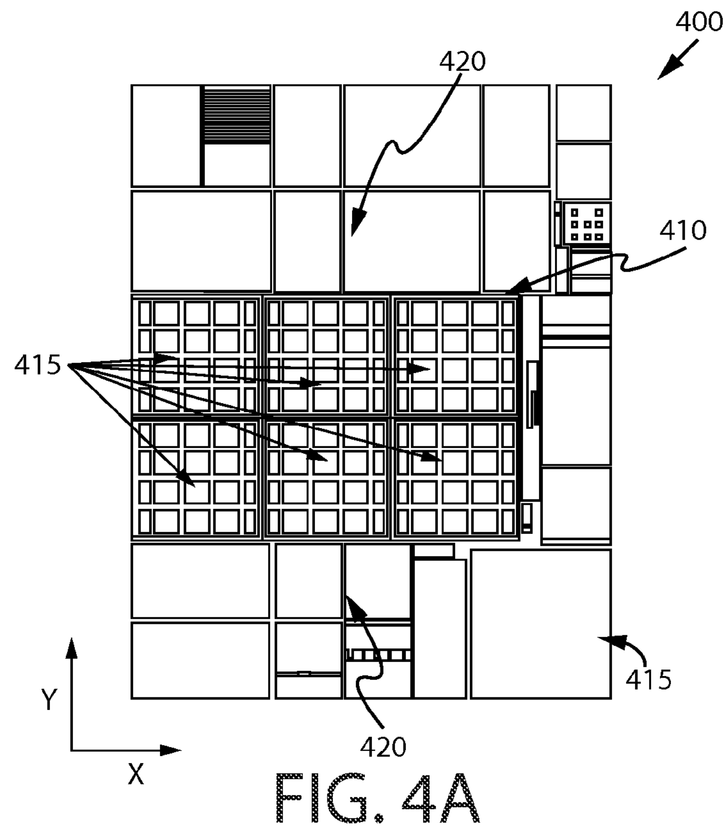
FIG. 4A is a plan view of an example of a layout according to some embodiments.
Figure 4B:
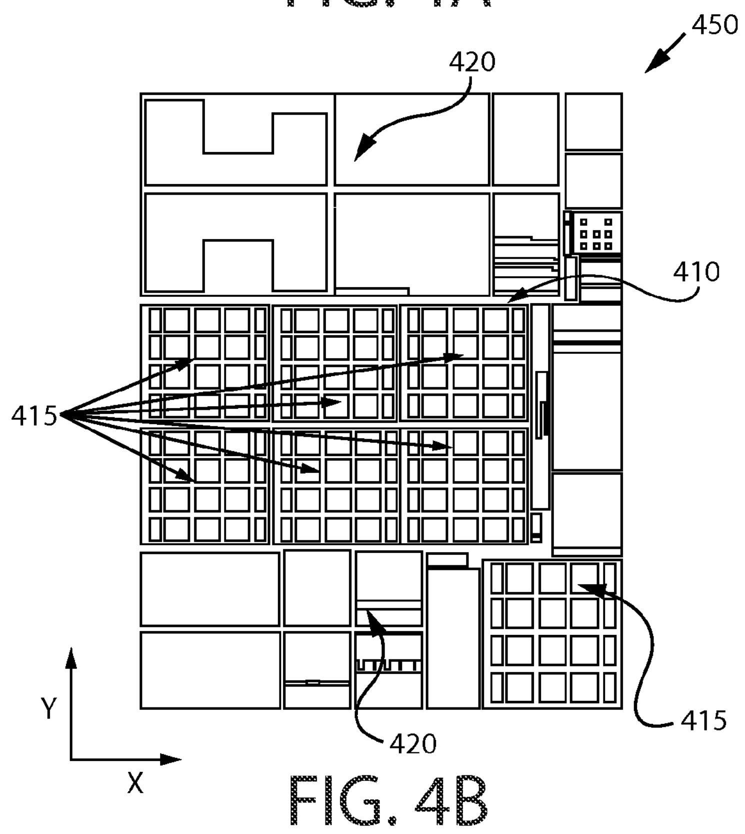
FIG. 4B is a plan view of an example of a layout according to some embodiments.

Referring now to FIGS. 4A and 4B, plan views of an example of a layout illustrating a global or region pattern density gradient according to some embodiments are provided. In the illustrated embodiment of FIG. 4A, an initial layout including an integrated circuit (IC) pattern layer having a plurality of circuit patterns is received in a computer. The layout includes a region 410 having a plurality of patterns having a high pattern density (e.g. between approximately 13/Angstrom (e.g. 12.5/Angstrom) and approximately 22/Angstrom (e.g. 22.5/Angstrom)) and includes regions 420 having a plurality of circuit patterns having a low pattern density (e.g. between approximately 3/Angstrom (e.g. 2.5/Angstrom) and approximately 7/Angstrom (e.g. 7.5/Angstrom)). In some embodiments, the initial layout is analyzed to determine a difference between the pattern densities of first circuit patterns (e.g. patterns 415 of high density region 410) in high density region 410 and the pattern densities of second circuit patterns (e.g. patterns of low density region 420) in low density region 410. In some embodiments, the initial layout is analyzed to determine a difference between the region or global pattern density of the high density region 410 and the region or global pattern density of the low density region 410. In the illustrated embodiment, the electrochemical plating process flow direction is substantially parallel to a direction of the y-axis shown in FIG. 4A.

In some embodiments, the determined pattern density difference of the first circuit patterns of the high density region and the second circuit patterns of the low density region is compared with a threshold pattern density difference. For example, the determined pattern density difference between circuit patterns 415 of high density region 410 having pattern densities between approximately 13/Angstrom and approximately 22/Angstrom and circuit patterns of low density region 420 having pattern densities between approximately 3/Angstrom and approximately 7/Angstrom is between approximately 10 and 15/Angstrom (e.g. between 9.5/Angstrom and 13.5/Angstrom). In some embodiments, the determined region or global pattern density difference between the high density region 410 and the low density region 420 is compared with the threshold pattern density difference. The threshold pattern density difference can have a value of 10/Angstrom and be stored, e.g., in a tangible, non-transitory machine readable storage medium. In this example, the comparison would indicate that the determined pattern density difference (between 10 and 15) reaches or exceeds the threshold pattern density difference (10).

Referring now to FIG. 4B, a revised layout 450 can be generated based on the comparison and including dummy patterns positioned in the low density region 420 such that the circuit patterns of low density region 420 have higher pattern densities (e.g. between approximately 13/Angstrom (e.g. 12.5/Angstrom) and approximately 15/Angstrom (e.g. 15.5 Angstrom). In some embodiments, a revised layout 450 can include dummy patterns positioned in the low density region 420 such that the region or global pattern density is increased (e.g. between approximately 13/Angstrom (e.g. 12.5/Angstrom) and approximately 15/Angstrom (e.g. 15.5 Angstrom) to decrease the pattern density difference between the high density region 410 and the low density region 420. The dummy patterns can be selected to have a pattern density to compensate for an estimated loss of filling material (e.g. Cu) during an electrochemical plating process in the circuit patterns 415 of high density region 410 due to the region or global pattern density gradient. In some embodiments, the dummy patterns can be selected to have a pattern density between the respective pattern densities of the circuit patterns of the high density region 410 and the low density region 420. For example, the dummy patterns can be selected to have a pattern density of 13/Angstrom to compensate for an estimated loss of filling material (e.g. Cu) during an electrochemical plating process in the circuit patterns 415 of high density region 410 due to the region or global pattern density gradient with the patterns of low density region 420. In some embodiments, the revised layout is displayed on a display. In some embodiments, a signal can be provided to a signal indicating device to indicate that the determined pattern density difference exceeds the threshold pattern density difference is achieved.

Figure 5A:
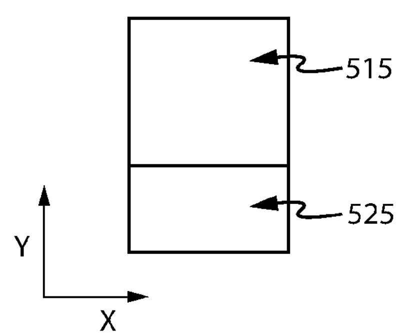
FIG. 5A is a plan view of an example of a portion of a layout according to some embodiments.
Figure 5B:
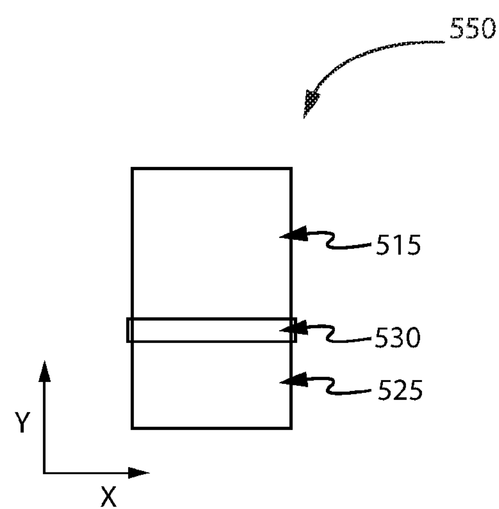
FIG. 5B is a plan view of an example of a portion of a layout according to some embodiments.

Referring now to FIGS. 5A and 5B, plan views of an example of circuit patterns in a portion of a layout illustrating a local pattern density gradient according to some embodiments are provided. In the illustrated embodiment of FIG. 5A, a localized portion 500 of an initial layout including a localized portion of an integrated circuit (IC) pattern layer having circuit patterns 515 and 525 is received in a computer. The localized portion of the layout includes a circuit pattern 515 having a high pattern density (e.g. approximately 14/Angstrom (e.g. between 13.5 and 14.5/Angstrom)) and a circuit pattern 525 having a low pattern density (e.g. approximately 2/Angstrom (e.g. between 1.5 and 2.5/Angstrom). In some embodiments, the portion 500 of the initial layout is analyzed to determine a localized difference between the pattern density of circuit pattern 515 and the pattern density of circuit pattern 525. In the illustrated embodiment, the electrochemical plating process flow direction is substantially parallel to a direction of the y-axis shown in FIG. 5A.

In some embodiments, the determined localized pattern density difference of circuit pattern 515 circuit pattern 525 is compared with a threshold pattern density difference. For example, the determined localized pattern density difference between circuit pattern 515 and circuit pattern 515 is approximately 12/Angstrom (e.g. between 11.5/Angstrom and 12.5/Angstrom). The threshold pattern density difference can have a value of 10/Angstrom and be stored, e.g., in a tangible, non-transitory machine readable storage medium. In this example, the comparison would indicate that the determined localized pattern density difference (12) reaches or exceeds the threshold pattern density difference (10).

Referring now to FIG. 5B, a portion 550 of a revised layout can be generated based on the comparison and including a dummy pattern 530 positioned between circuit pattern 515 and circuit pattern 525 to decrease the localized pattern density difference or gradient. The dummy pattern 530 can be selected to have a pattern density to compensate for an estimated loss of filling material (e.g. Cu) during an electrochemical plating process in the circuit pattern 415 due to the localized pattern density gradient. In some embodiments, the dummy pattern 530 can be selected to have a pattern density between the respective pattern densities of circuit patterns 515, 525. For example, the dummy pattern 530 can be selected to have a pattern density of 8/Angstrom to compensate for an estimated loss of filling material (e.g. Cu) during an electrochemical plating process in the circuit pattern 515 due to the localized pattern density gradient with the circuit pattern 525.

Figure 6:
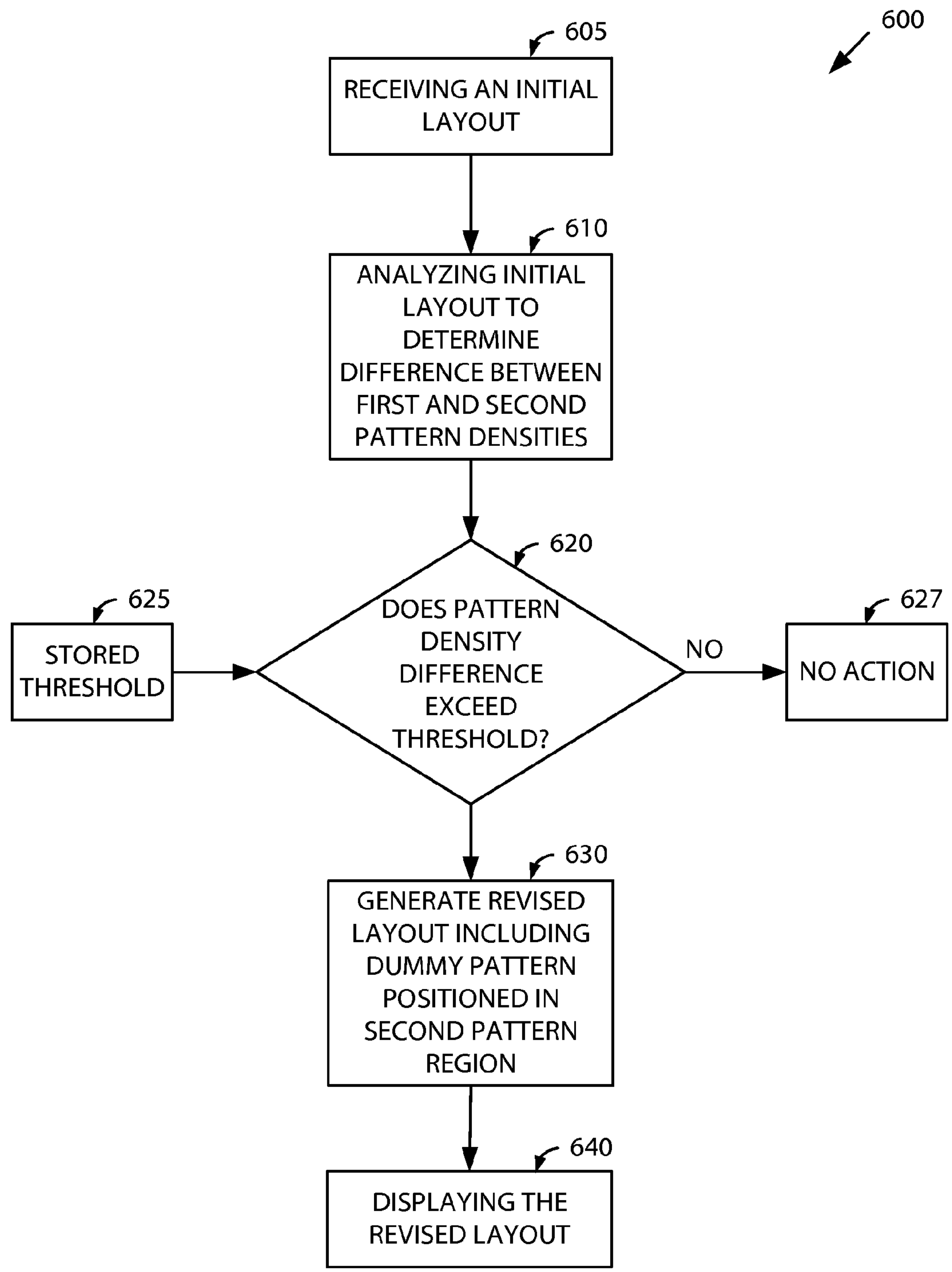
FIG. 6 is a flow chart illustrating a computer-implemented method of compensating for filling material losses in an electroplating process.

With reference to FIG. 6, a flow chart illustrating a computer-implemented method of compensating for filling material losses in an electroplating process is provided. At block 605, an initial layout (e.g. 400) is received in a computer. At block 610, the received initial layout (e.g. 400) is analyzed to determine a region or global difference between a pattern density of a first circuit pattern region (e.g. circuit patterns 415 of high density region 410) above a semiconductor substrate and a pattern density of a second circuit pattern region (e.g. circuit patterns of low density region 420) adjacent to the first circuit pattern region. In some embodiments, a portion (e.g. 500) of the received initial layout is analyzed to determine a localized difference between a pattern density of a first circuit pattern (e.g. circuit pattern 515) above a semiconductor substrate and a pattern density of a second circuit pattern (e.g. circuit pattern 525) adjacent to the first circuit pattern. At block 620, the determined global or region pattern density difference of the first and second circuit pattern regions is compared with a threshold pattern density difference as described above for blocks 120, 220. In some embodiments, the determined localized pattern density difference of the first and second circuit patterns is compared with a threshold pattern density difference as described above for blocks 120, 220. At block 625, the threshold pattern density difference is stored as described above for blocks 125, 225. At block 627, if the pattern density difference (e.g. global, region, localized, etc.) is determined to be less than the threshold pattern density difference, no action is required as described above for blocks 127, 227. At block 630, if the global or region pattern density difference of the first and second circuit pattern regions is determined to exceed the threshold pattern density difference, a revised layout (e.g. 450) can be generated based on the comparison and including dummy patterns positioned in the low density region (e.g. 420). In some embodiments, if the localized pattern density difference of the first (e.g. 515) and second (e.g. 525) circuit patterns is determined to exceed the threshold pattern density difference, a portion (e.g. 550) of a revised layout can be generated based on the comparison and including a dummy pattern (e.g. 530) positioned between the first pattern (e.g. 515) and the second pattern (e.g. 525). At block 640, the revised layout (e.g. 450) or portion thereof (e.g. 550) can be displayed on a display device.

Figure 7:
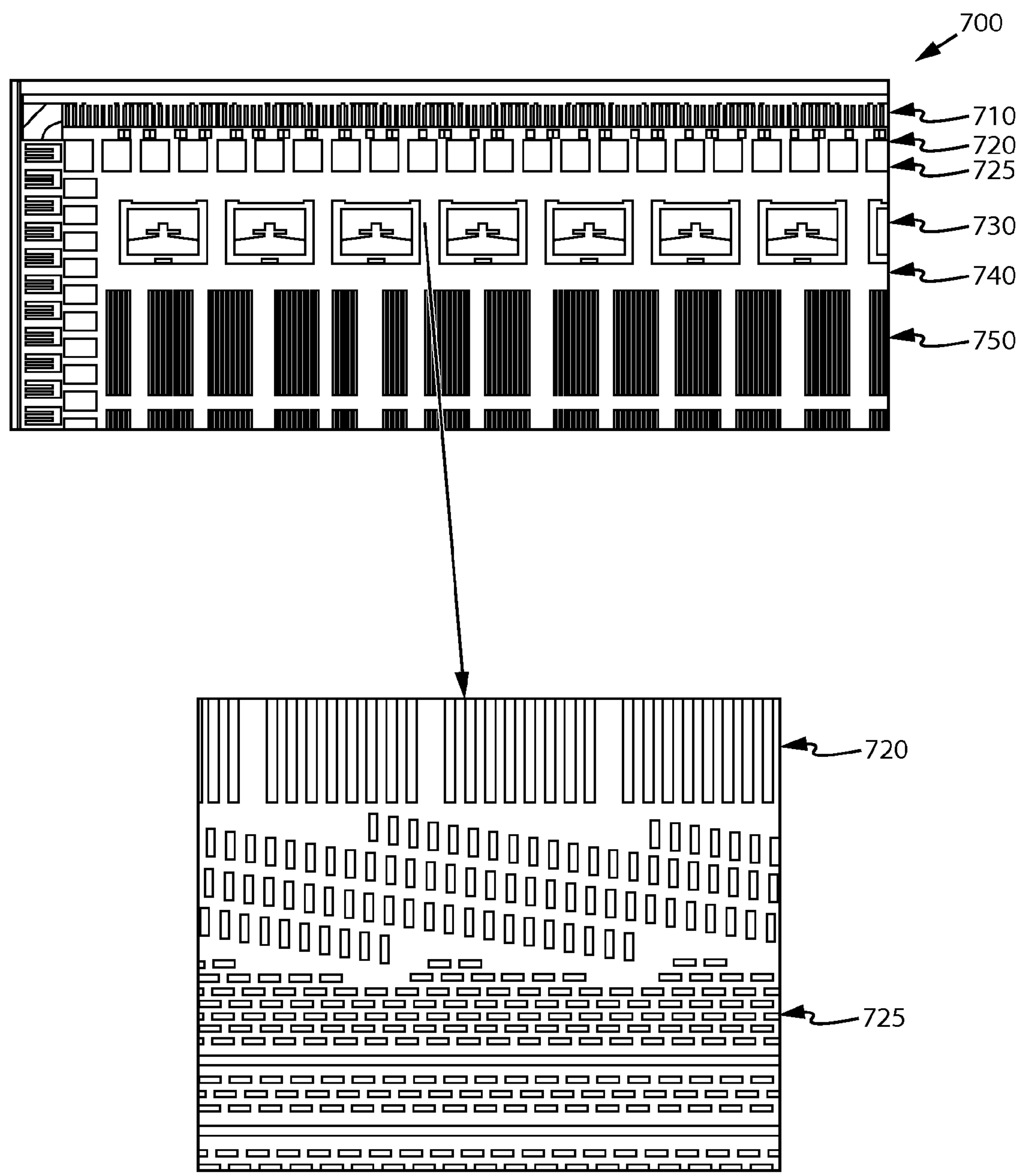
FIG. 7 is a plan view of an example of a layout and an exploded view of an example of a dummy pattern layout according to some embodiments.

With reference to FIG. 7, a plan view of an example of a layout 700 of an integrated circuit pattern layer and an exploded view of an example of a dummy pattern layout according to some embodiments is provided. In the illustrated example, an IC pad die (e.g. SRAM, DRAM) 710, an electronic fuse (e-fuse) die 720, and an IC die (e.g. SRAM, DRAM) 750, are provided. As shown in FIG. 7, a plurality of dummy patterns 720, 725 can be inserted so as to compensate for an estimated loss of filling material, at respective boundaries between respective high pattern density patterns and respective low pattern density patterns of, and induced by the respective pattern density differences exceeding a threshold pattern density difference. As shown in the exploded view of FIG. 7, dummy patterns 720, 725 can be inserted. In the illustrated embodiment, an optical proximity correction (OPC) dummy 725 can be inserted.

Figure 8:
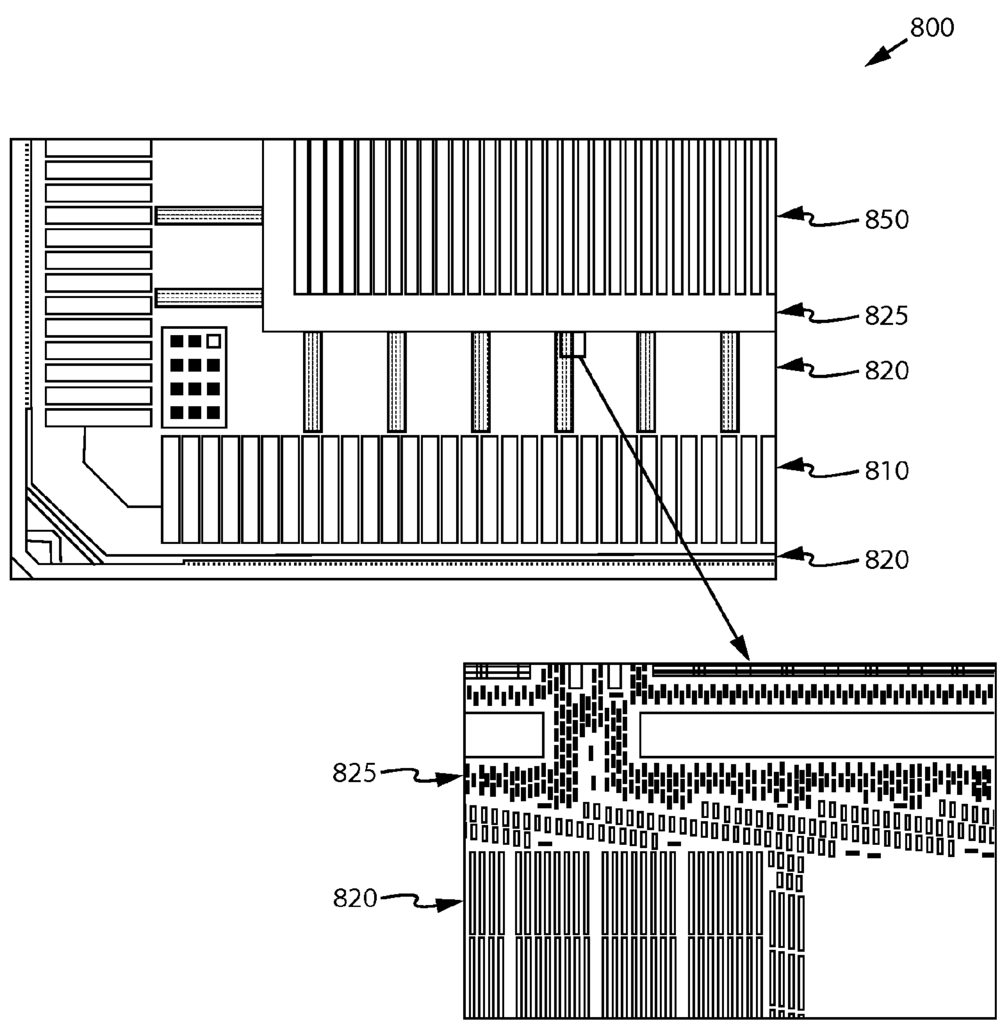
FIG. 8 is a plan view of an example of a layout and an exploded view of an example of a dummy pattern layout according to some embodiments.

Referring now to FIG. 8, a plan view of another example of a layout 800 of an integrated circuit pattern layer and an exploded view of an example of a dummy pattern layout according to some embodiments is provided. In the illustrated example, an IC die (e.g. SRAM, DRAM) 850 and an IC pad die (e.g. SRAM, DRAM) 810 are provided. As shown in FIG. 8, a plurality of dummy patterns 820, 825 can be inserted so as to compensate for respective pattern density differences determined to exceed a threshold pattern density difference. As shown in the exploded view of FIG. 8, dummy patterns 820, 825 can be inserted, including OPC dummy 825.

In some embodiments, steps of the method can be implemented by a general purpose computer programmed in accordance with the principals discussed herein. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features can be described above as acting in certain combinations and even initially claimed as such, one or more features from a claimed combination can in some cases be excised from the combination, and the claimed combination can be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing can be advantageous. Moreover, the separation of various system components in the embodiments described above should not be understood as requiring such separation in all embodiments, and it should be understood that the described program components and systems can generally be integrated together in a single software product or packaged into multiple software products.

Processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Figure 9:
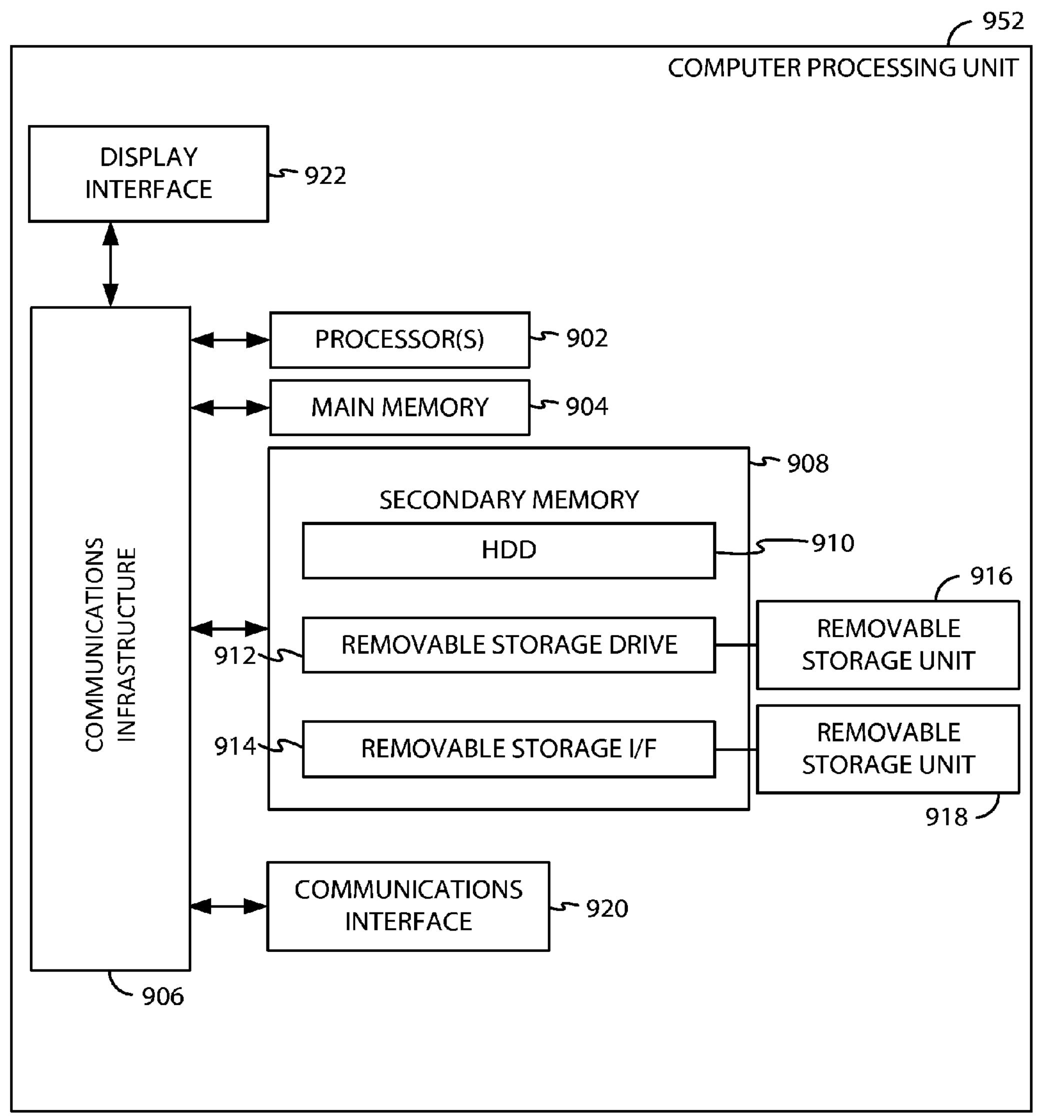
FIG. 9 is a diagram of an illustrative example of an architecture of a computer processing unit according to some embodiments.

A diagram of an illustrative example of an architecture of a computer processing unit according to some embodiments is shown in FIG. 9. Embodiments of the subject matter and the functional operations for various steps of processes described in this specification can be implemented in electronic circuitry, or in computer firmware, or hardware, including the structures disclosed in this specification and their equivalents, or in combinations of one or more of them. Embodiments of the subject matter described in this specification can be implemented as one or more computer program products, i.e., one or more modules of computer program instructions encoded on a non-transitory, tangible machine readable storage medium for execution by, or to control the operation of, data processing apparatus. The non-transitory, tangible storage medium can be a non-transitory computer readable storage medium. The computer readable medium can be a machine-readable storage device, a machine-readable storage medium, a memory device (e.g., flash or random access memory), a hard disk drive, a tape drive, an optical drive (such as, but not limited to CDROM, DVD, or BDROM) or the like, or a combination of one or more of them.

At least a portion of the system for compensating for filling material losses in an electroplating process described herein can be implemented in computer processing unit 900 and specifically in software and where results (e.g. pattern density (e.g. line edge density), pattern density difference, threshold pattern density difference, initial layout, revised layout, perimeter sum parameter, pattern area parameter, comparison of pattern density difference and threshold pattern density difference, dummy pattern selection, dummy pattern size, number of dummy patterns selected, dummy pattern position. etc.) can be presented to system operator on a graphical user interface (GUI) on a display device such as a computer monitor 924 (926) or other display device. Embodiments of the subject matter described in this specification can be implemented on a computer 900 having a keyboard, pointing device, e.g., a mouse or a trackball, by which the operator can provide input to the computer. Other kinds of devices can be used to provide for interaction with an operator as well; for example, input from the operator can be received in any form, including acoustic, speech, or tactile input. In some embodiments, the computer system 1000 includes functionality providing for various components of the systems for compensating for local focus errors in semiconductor processes and steps of the corresponding methods as described, for example, in FIGS. 1-6.

As illustrated in FIG. 9, computer processing unit 900 can include one or more processors 902. The processor 902 is connected to a communication infrastructure 906 (e.g., a communications bus, cross-over bar, or network). Computer processing unit 900 can include a display interface 922 that forwards graphics, text, and other data from the communication infrastructure 906 (or from a frame buffer not shown) for display on the display unit 924.

Computer processing unit 900 can also include a main memory 904, such as a random access memory (RAM), and a secondary memory 908. The secondary memory 908 can include, for example, a hard disk drive (HDD) 910 and/or removable storage drive 912, which can represent a floppy disk drive, a magnetic tape drive, an optical disk drive, or the like. The removable storage drive 912 reads from and/or writes to a removable storage unit 916. Removable storage unit 916 can be a floppy disk, magnetic tape, optical disk, or the like. As will be understood, the removable storage unit 916 can include a computer readable storage medium having stored therein computer software and/or data. Computer readable storage media suitable for storing computer program instructions and data include all forms data memory including nonvolatile memory, media and memory devices, including by way of example semiconductor memory devices, e.g., EPROM, EEPROM, and flash memory devices; magnetic disks, e.g., internal hard disks or removable disks; magneto optical disks; and CD ROM, DVD-ROM, and BDROM disks. The processor 902 and the memory 904 can be supplemented by, or incorporated in, special purpose logic circuitry.

In alternative embodiments, secondary memory 908 can include other similar devices for allowing computer programs or other instructions to be loaded into computer processing unit 900. Secondary memory 908 can include a removable storage unit 918 and a corresponding interface 914. Examples of such removable storage units include, but are not limited to, USB or flash drives, which allow software and data to be transferred from the removable storage unit 918 to computer processing unit 900.

Computer processing unit 900 can also include a communications interface 920. Communications interface 920 allows software and data to be transferred between computer processing unit 900 and external devices. Examples of communications interface 920 can include a modem, Ethernet card, wireless network card, a Personal Computer Memory Card International Association (PCMCIA) slot and card, or the like. Software and data transferred via communications interface 920 can be in the form of signals, which can be electronic, electromagnetic, optical, or the like that are capable of being received by communications interface 920. These signals can be provided to communications interface 920 via a communications path (e.g., channel), which can be implemented using wire, cable, fiber optics, a telephone line, a cellular link, a radio frequency (RF) link and other communication channels.

The computer program products provide software to computer processing unit 900. Computer programs (also referred to as computer control logic) are stored in main memory 904 and/or secondary memory 908. Computer programs can also be received via communications interface 920. Such computer programs, when executed by a processor, enable the computer system 900 to perform features of the method discussed herein. For example, main memory 904, secondary memory 908, or removable storage units 916 or 918 can be encoded with computer program code for performing various steps of the processes described in FIGS. 1-5.

In an embodiment implemented using software, the software can be stored in a computer program product and loaded into computer processing unit 900 using removable storage drive 912, hard drive 910, or communications interface 920. The software, when executed by a processor 902, causes the processor 902 to perform the functions of various steps of the methods described herein. In some embodiments, various steps of the methods can be implemented primarily in hardware using, for example, hardware components such as a digital signal processor comprising application specific integrated circuits (ASICs). In some embodiments, the method is implemented using a combination of both hardware and software.

Various embodiments can be implemented in a computing system that includes a back end component, e.g., as a data server, or that includes a middleware component, e.g., an application server, or that includes a front end component, e.g., a computer having a GUI or a Web browser through which an operator can interact with an implementation of the subject matter described is this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), e.g., the Internet.

Figure 10:
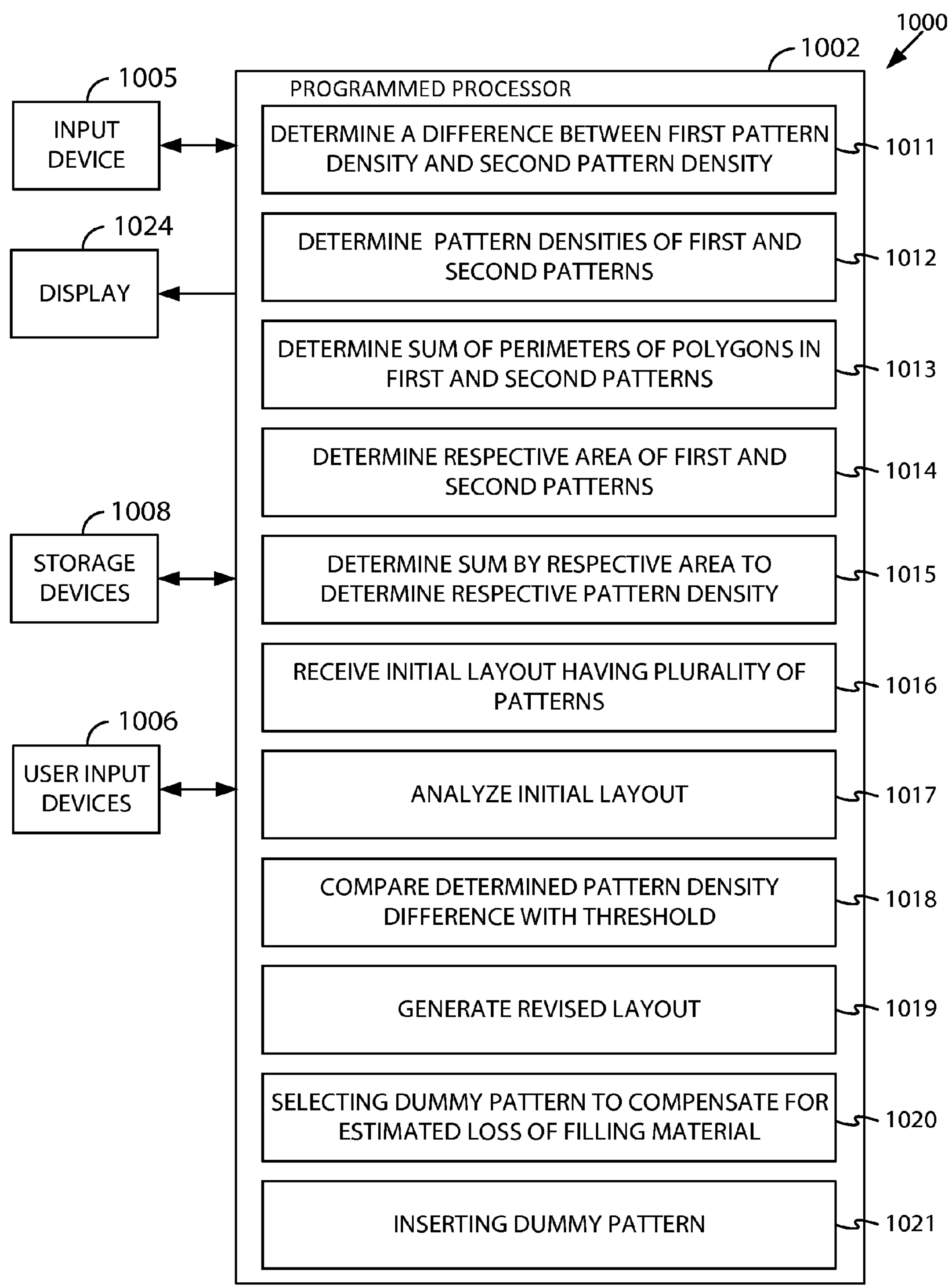
FIG. 10 is a block diagram of a processor system for performing a method described herein.

Many of the steps described above are adapted to be performed using a programmed processor 902 of system 900. For example, FIG. 10 shows a processor 1002 programmed to perform the method steps. The steps can be performed by a plurality of separate computer programs, or by a program that prompts the user for additional inputs between and/or during steps. These steps can include one or more of the determining pattern densities of first and second circuit patterns 1012, determining a pattern density difference between a first circuit pattern and a second circuit pattern 1011, determining a respective sum of perimeters of objects (e.g. polygons) in first and second circuit patterns 1013, determining a respective area of first and second circuit patterns 1014, dividing a respective sum by respective area to determine respective pattern density 1015, receiving initial layout having a plurality of circuit patterns 1016, analyzing initial layout 1017, comparing determined pattern density difference with threshold 1018, generating a revised layout 1019, selecting a dummy pattern to compensate for an estimated loss of filling material during an electrochemical plating process 1020, and inserting a dummy pattern 1021.

In some embodiments, all numerically intensive calculations are performed by a programmed processor, and the results presented to the user (e.g., engineer) at certain decision points to allow input of engineering judgment. In the illustrated embodiment, the programmed processor 1002 receives a variety of inputs including, but not limited to, an input from input device 1005, user input device 1006, and storage device 1008. As shown in FIG. 10, the programmed processor 1002 can provide a variety of outputs including, but not limited to, an output to display 1004, user input device 1006, storage device 1008, and input device 1005. Although FIG. 10 shows a single processor, in other embodiments, various subsets of the processes 1011-1021 can be executed on a plurality of programmed processors, which can optionally be connected to each other by a communications network, such as a personal area network, a local area network, a wide area network, and/or the Internet.

In some embodiments, system 1000 can include an electronic design automation ("EDA") tool for analog, radio frequency (RF) and mixed-signal circuits. In some embodiments, a computing system can include a general purpose processor (e.g. 802, FIG. 8) programmed with computer program code that configures the circuits of the processor 802 to function as an EDA tool. Examples of suitable EDA tools include, but are not limited to "ADVANCED DESIGN SYSTEM (ADS)"™, sold by Agilent. of Santa Clara, Calif., which can include a schematic capture tool and a circuit simulator that provides SPICE-level analog and RF simulation. Other EDA tools can be used, such as the "CADENCE® VIRTUOSO® SPECTRE®" circuit simulator. sold by Cadence Design Systems, Inc. of San Jose, Calif.

In some embodiments, the EDA tool can be implemented in special purpose hardware including application specific integrated circuitry, for example.

In some embodiments, an EDA tool can be a special purpose computer formed by retrieving stored program instructions from a non-transient computer readable storage medium 812 and executing the instructions on a general purpose processor 802. In some embodiments, a tangible, non-transient machine readable storage medium 812 can be configured to store inputs used by an EDA tool and layout data generated by a place and route tool. In some embodiments, a place and route tool can be configured to receive an identification of a plurality of patterns to be included in an integrated circuit ("IC") layout, including a net list of pairs of cells within the plurality of cells to be connected to each other. In some embodiments, a place and route tool can be configured to use a set of default design rules as well as foundry specific and/or technology node specific parameters included in a technology file.

In some embodiments, a computer-implemented method is provided. A difference between a pattern density of a first circuit pattern and a pattern density of a second circuit pattern adjacent to the first circuit pattern is determined using a computer. A dummy pattern is inserted between the first circuit pattern and the second circuit pattern so as to compensate for an estimated loss of filling material during electrochemical plating induced by the pattern density difference exceeding a threshold pattern density difference.

In some embodiments, a computer-implemented system is provided. The system includes a tangible, non-transitory computer readable storage medium encoded with data representing an initial layout of an integrated circuit pattern layer having a plurality of circuit patterns and a special-purpose computer. The special-purpose computer is configured to perform the steps of determining a pattern density difference between a first circuit pattern above a semiconductor substrate and a second circuit pattern adjacent to the first circuit pattern, comparing the determined pattern density difference with a threshold pattern density difference, selecting a dummy pattern so as to compensate for an estimated loss of filling material during electrochemical plating at a boundary of the first and second patterns based on the comparison and inserting the dummy pattern between the first circuit pattern and the second circuit pattern.

In some embodiments, a computer-implemented method is provided. The method includes receiving an initial layout comprising an integrated circuit pattern layer having a plurality of circuit patterns using a computer. The initial layout is analyzed to determine a difference between a pattern density of a first circuit pattern region and a pattern density of a second circuit pattern region adjacent to the first circuit pattern region. The determined pattern density difference is compared with a threshold pattern density difference stored in a tangible, non-transitory machine readable storage medium. A revised layout is generated based on the comparison and includes dummy patterns positioned in the second circuit pattern region so as to compensate for an estimated loss of filling material during electrochemical plating in the first circuit pattern region.

While various embodiments have been described, it is to be understood that the embodiments described are illustrative only and that the scope of the subject matter is to be accorded a full range of equivalents, many variations and modifications naturally occurring to those of skill in the art from a perusal hereof.

What is claimed is:

1. A computer-implemented method, comprising:

determining, using a computer, a local pattern density magnitude gradient along circuit patterns, each comprising a respective plurality of objects, in adjacent cells of a plurality of cells of an integrated circuit layout wherein the adjacent cells are disposed along an electroplating process flow direction;

determining, using the computer, a respective pattern perimeter sum parameter as a sum of the respective perimeter magnitudes of each of the respective objects in each of the respective circuit patterns in the adjacent cells;

selecting a dummy pattern having a pattern density magnitude between respective pattern density magnitudes of the circuit patterns in the adjacent cells so as to compensate for an estimated loss of filling material during electrochemical plating induced by the local pattern density magnitude gradient exceeding a threshold pattern density magnitude gradient for circuit patterns in the adjacent cells, wherein the selected dummy pattern has a respective pattern perimeter sum parameter between the respectively determined pattern perimeter sum parameters for the circuit patterns in the adjacent cells;

inserting the selected dummy pattern at a boundary between the circuit patterns in the adjacent cells of the layout; and controlling an electroplating process based on the layout.

2. The method of claim 1, wherein the filling material is copper (Cu).

3. The method of claim 1, wherein the integrated circuit layout is for a conductive line layer.

4. The method of claim 1, wherein the integrated circuit layout is for an interconnect layer.

5. The method of claim 1, wherein the threshold pattern density magnitude gradient for circuit patterns in adjacent cells is a magnitude between about 5 and about 20.

6. The method of claim 1, wherein the threshold pattern density magnitude gradient for circuit patterns in adjacent cells is a magnitude of approximately 10.

7. The method of claim 1, further comprising:

generating a revised integrated circuit layout having the selected dummy pattern inserted at the boundary between the circuit patterns in the adjacent cells.

8. The method of claim 7, further comprising:

causing a display device to graphically display the revised integrated circuit layout.

9. The method of claim 1, further comprising:

depositing the filling material using the electrochemical plating process.

10. A non-transitory computer readable storage medium encoded with computer program instructions, such that when a processor executes the computer program instructions, the processor performs a method comprising:

determining a local pattern density magnitude gradient along circuit patterns disposed in cells adjacent to each other and along an electroplating process flow direction wherein the adjacent cells are respective cells of an integrated circuit layout and wherein the respective circuit patterns in the adjacent cells each comprise a respective plurality of objects;

comparing the determined local pattern density magnitude gradient with a threshold pattern density magnitude gradient for circuit patterns in adjacent cells;

determining a respective sum of respective perimeter magnitudes of each of the plurality of objects in each of the respective circuit patterns in the adjacent cells;

selecting a dummy pattern based on the comparison and having a respective pattern perimeter sum parameter between the respectively determined sums for the circuit patterns in the adjacent cells so as to compensate for an estimated loss of filling material at a transition point between the circuit patterns in the adjacent cells and during an electrochemical plating process along the process flow direction;

inserting the selected dummy pattern at the transition point between the circuit patterns in the adjacent cells of the layout; and controlling an electroplating process based on the layout.

11. The computer readable storage medium of claim 10, encoded with computer program instructions, such that when the processor executes the computer program instructions, the processor performs the method further comprising:

causing a display device to display a revised integrated circuit layout including the selected dummy pattern inserted at the transition point between the circuit patterns in the adjacent cells.

12. The computer readable storage medium of claim 10, wherein the integrated circuit layout is for a layer selected from the group consisting of: a conductive line layer and a via layer; and wherein the adjacent cells are disposed along an edge of the layout.

13. The method of claim 10, further comprising:

depositing filling material based on the layout.

14. A computer-implemented method, comprising:

receiving an initial layout in a computer, the initial layout comprising a plurality of cells in a grid, wherein respective integrated circuit patterns, each comprising a respective plurality of objects, are disposed in respective cells of the plurality of cells and wherein a group of cells in a region of the grid are adjacent to another group of cells in another region of the grid, and wherein the adjacent cells are disposed along an electroplating process flow direction;

analyzing the initial layout to determine a respective sum of respective perimeter magnitudes of each of the respective objects in each circuit pattern in the adjacent cells and a pattern density magnitude gradient along circuit patterns in the adjacent cells;

comparing the determined pattern density magnitude gradient with a threshold pattern density magnitude gradient for circuit patterns in adjacent cells stored in a tangible, non-transitory machine readable storage medium;

generating a revised layout in the computer based on the comparison including dummy patterns selected based on the determined pattern density magnitude gradient and positioned at a boundary between the circuit patterns in the adjacent cells so as to compensate for an estimated loss of filling material during an electrochemical plating process in the adjacent cells, wherein one or more of the selected dummy patterns has a respective pattern perimeter sum parameter between the respectively determined sums for the circuit patterns in the adjacent cells; and controlling an electroplating process based on the revised layout.

15. The method of claim 14, further comprising:

displaying the revised layout.

16. The method of claim 14, further comprising:

determining at the computer the respective pattern density magnitudes of the circuit patterns in the adjacent cells; and wherein the selected dummy patterns have respective pattern density magnitudes between the respectively determined pattern density magnitudes of the circuit patterns in the adjacent cells.

17. The method of claim 14, further comprising:

depositing filling material based on the revised layout.

* * * * *